(12) United States Patent
Williamson

(10) Patent No.: US 8,088,560 B2
(45) Date of Patent: Jan. 3, 2012

(54) METHOD OF MAKING A LITHOGRAPHIC PRINTING PLATE

(75) Inventor: Alexander Williamson, Mortsel (BE)

(73) Assignee: Agfa Graphics NV, Mortsel (BE)

( * ) Notice: Subject to any disclaimer, the term of this patent is extended or adjusted under 35 U.S.C. 154(b) by 813 days.

(21) Appl. No.: 12/094,285

(22) PCT Filed: Nov. 15, 2006

(86) PCT No.: PCT/EP2006/068498
§ 371 (c)(1),
(2), (4) Date: May 20, 2008

(87) PCT Pub. No.: WO2007/057413
PCT Pub. Date: May 24, 2007

(65) Prior Publication Data
US 2009/0047603 A1 Feb. 19, 2009

Related U.S. Application Data

(60) Provisional application No. 60/749,839, filed on Dec. 13, 2005.

(30) Foreign Application Priority Data

Nov. 21, 2005 (EP) .................... 05111025

(51) Int. Cl.
*G03F 7/26* (2006.01)
*G03F 7/028* (2006.01)

(52) U.S. Cl. ............... 430/302; 430/273.1; 430/300; 430/916

(58) Field of Classification Search .......... 430/300, 430/302, 273.1, 916
See application file for complete search history.

(56) References Cited

U.S. PATENT DOCUMENTS

| | | |
|---|---|---|
| 6,027,857 A | 2/2000 | Li et al. |
| 6,071,675 A | 6/2000 | Teng |
| 6,171,735 B1 | 1/2001 | Li et al. |
| 6,245,481 B1 | 6/2001 | Teng |
| 6,387,595 B1 | 5/2002 | Teng |
| 6,420,089 B1 | 7/2002 | Baumann et al. |
| 6,435,740 B1 * | 8/2002 | Nozawa et al. ............ 396/612 |
| 6,482,571 B1 | 11/2002 | Teng |
| 6,548,222 B2 | 4/2003 | Teng |
| 6,576,401 B2 | 6/2003 | Teng |
| 2003/0165777 A1 | 9/2003 | Teng |
| 2004/0013968 A1 | 1/2004 | Teng |
| 2004/0214105 A1 | 10/2004 | Hoshi et al. |
| 2005/0039620 A1 | 2/2005 | Kakino et al. |
| 2005/0266349 A1 * | 12/2005 | Van Damme et al. ........ 430/300 |

FOREIGN PATENT DOCUMENTS

| | | |
|---|---|---|
| EP | 0 851 299 A1 | 7/1998 |
| EP | 1 091 251 A2 | 4/2001 |
| EP | 1 491 356 A2 | 12/2004 |
| EP | 1 495 866 A2 | 1/2005 |
| EP | 1 500 498 A2 | 1/2005 |
| EP | 1 520 694 A2 | 4/2005 |
| EP | 1 557 262 A2 | 7/2005 |
| WO | 93/05446 A1 | 3/1993 |
| WO | 03/087939 A2 | 10/2003 |

OTHER PUBLICATIONS

Official communication issued in the International Application No. PCT/EP2006/068498, mailed on Feb. 27, 2007.

* cited by examiner

*Primary Examiner* — Anca Eoff
(74) *Attorney, Agent, or Firm* — Keating & Bennett, LLP

(57) ABSTRACT

A method of making a lithographic printing plate includes the steps of: (a) providing a lithographic printing plate precursor including a support having a hydrophilic surface or which is provided with a hydrophilic layer, and a coating on the support, the coating including (i) at least one image-recording layer which includes a photocurable composition, and (ii) on top thereof, an oxygen-barrier layer including a water-soluble or water-swellable polymer, b) image-wise exposing the coating, (c) optionally, heating the precursor in a pre-heating unit, (d) treating the image-wise exposed precursor with water or an aqueous solution to remove at least a portion of the oxygen-barrier layer, (e) mounting the treated precursor on a plate cylinder of a lithographic printing press, and (f) developing the precursor by rotating the plate cylinder while feeding dampening liquid and/or ink to the coating, thereby removing non-exposed areas of the image-recording layer.

9 Claims, No Drawings

METHOD OF MAKING A LITHOGRAPHIC PRINTING PLATE

CROSS-REFERENCE TO RELATED APPLICATIONS

This application is a 371 of PCT/EP2006/068498, filed Nov. 15, 2006. This application claims the benefit of U.S. Provisional application No. 60/749,839, filed Dec. 13, 2005, which is incorporated by reference herein in its entirety. In addition, this application claims the benefit of European application No. 05111025.2, filed Nov. 21, 2005, which is also incorporated by reference herein in its entirety.

BACKGROUND OF THE INVENTION

1. Field of the Invention

The present invention relates to a method for making a lithographic printing plate whereby a negative-working photopolymer printing plate precursor is image-wise exposed, treated with water or an aqueous solution whereby at least a portion of the oxygen barrier layer is removed, mounted on a press, and processed on-press by applying ink and fountain solution to remove the unexposed areas from the support.

2. Description of the Related Art

In lithographic printing, a so-called printing master such as a printing plate is mounted on a cylinder of the printing press. The master carries a lithographic image on its surface and a printed copy is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called "driographic" printing, the lithographic image consists of ink-accepting and ink-adhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout, and imposition are accomplished digitally and each color selection is transferred to graphic arts film using an image-setter. After processing, the film can be used as a mask for the exposure of an imaging material called a plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided into three categories: (i) silver plates, which work according to the silver salt diffusion transfer mechanism; (ii) photopolymer plates which contain a photopolymerizable composition that hardens upon exposure to light; and (iii) thermal plates of which the imaging mechanism is triggered by heat or by light-to-heat conversion. Thermal plates are mainly sensitized for infrared lasers emitting at 830 nm or 1064 nm. Photopolymers can be sensitized for blue, green, or red light (i.e., wavelength range between 450 and 750 nm), for violet light (i.e., wavelength range between 350 and 450 nm) or for infrared light (i.e., wavelength range between 750 and 1500 nm). Laser sources have been increasingly used to expose a printing plate precursor which is sensitized to a corresponding laser wavelength. Typically, an Ar laser (488 nm) or a FD-YAG laser (532 nm) can be used for exposing a visible light sensitized photopolymer plate. The wide-scale availability of low cost blue or violet laser diodes, originally developed for data storage by means of DVD, has enabled the production of plate-setters operating at shorter wavelength. More specifically, semiconductor lasers emitting from 350 to 450 nm have been achieved using an InGaN material. An infrared laser diode emitting around 830 nm or a Nd-YAG laser emitting around 1060 nm can also be used.

Typically, a photopolymer plate is processed in an alkaline developer having a pH>10 and subsequently gummed to protect the plate from contamination, e.g., by oxidation, fingerprints, fats, oil or dust, or from damaging, e.g., by scratches during handling of the plate.

Photopolymer plates are also described in the literature wherein the wet processing and gumming steps are replaced by an on-press processing whereby the imaged precursor is mounted on a press and processed on-press by applying ink and fountain solution to remove the unexposed areas from the support. Methods for preparing such plates are disclosed in WO 93/05446, U.S. Pat. No. 6,027,857, U.S. Pat. No. 6,171,735, U.S. Pat. No. 6,420,089, U.S. Pat. No. 6,071,675, U.S. Pat. No. 6,245,481, U.S. Pat. No. 6,387,595, U.S. Pat. No. 6,482,571, U.S. Pat. No. 6,576,401, U.S. Pat. No. 6,548,222, WO 03/087939, U.S. 2003/0165777, and U.S. 2004/0013968. A compound for increasing the adhesion between the photopolymer coating and the support can also be added to the printing plate precursor for increasing the resistance of the exposed areas during the processing step and for improving the durability of the plate in the printing process as disclosed in EP 851 299, EP 1 091 251, U.S. 2004/0214105, EP 1 491 356, U.S. 2005/0039620, EP 1 495 866, EP 1 500 498, EP 1 520 694, and EP 1 557 262.

A problem associated with on-press processing of such photopolymer printing plates is the lack of daylight stability, i.e., the image is not stable before processing due to curing of the non-exposed areas by exposure to ambient light and, therefore, the exposed plate needs to be processed within a short time after the exposure. However, since on-press processing is not possible during a print job, the end-user must wait until the previous print job has been completed before the exposed plate can be mounted on the press and processed. As a result, the exposure of the plate for the next print job must be delayed until just before the completion of the previous print job, so as to avoid that the unprocessed plate is affected by the ambient light. Alternatively, the exposed plate must be kept under safe-light conditions, but this again reduces the ease of use and convenience that are normally associated with e.g., violet- and infrared-sensitive photopolymer plates.

SUMMARY OF THE INVENTION

In order to overcome the problems described above, preferred embodiments of the present invention provide a method for making a lithographic printing plate wherein the exposed photocurable printing plate precursor can be kept in ambient light for an unlimited time before being mounted on the press and starting the on-press processing step. A preferred embodiment of the present invention includes a method having the specific feature that, after image-wise exposure, the precursor is subsequently treated with water or an aqueous solution whereby at least a portion of the oxygen barrier layer is removed and whereby the oxygen permeability of the coating is increased to such an extent that further curing of the non-exposed areas of the coating, exposed to ambient light, is inhibited by quenching of free radicals by atmospheric oxygen. As an additional advantage, the coating at the non-exposed areas is not completely removed from the support and this remaining coating protects the hydrophilic surface of the support from contamination or damaging.

Other features, elements, steps, characteristics and advantages of the present invention will become more apparent from the following detailed description of preferred embodiments of the present invention.

DETAILED DESCRIPTION OF THE PREFERRED EMBODIMENTS

In accordance with a preferred embodiment of the present invention, there is provided a method of making a lithographic printing plate including the steps of: (a) providing a lithographic printing plate precursor including a support having a hydrophilic surface or which is provided with a hydrophilic layer, and a coating on the support, the coating including (i) at least one image-recording layer which includes a photocurable composition, the composition including a compound which is capable of forming free radicals upon image-wise exposure, and (ii) on top thereof, an oxygen-barrier layer including a water-soluble or water-swellable polymer, (b) image-wise exposing the coating, (c) optionally, heating the precursor in a pre-heating unit, (d) treating the image-wise exposed precursor with water or an aqueous solution to remove at least a portion of the oxygen-barrier layer, thereby increasing the oxygen permeability of the coating to such an extent that curing of the non-exposed areas of the coating by ambient light is inhibited by quenching of free radicals with oxygen, (e) mounting the treated precursor on a plate cylinder of a lithographic printing press, and (f) developing the precursor by rotating the plate cylinder while feeding dampening liquid and/or ink to the coating, thereby removing non-exposed areas of the image-recording layer.

In a preferred embodiment of the present invention, the printing plate precursor is image-wise exposed off-press by a plate setter. The precursor used in a preferred embodiment of the present invention is negative-working wherein the exposed areas of the coating are hardened. Here, "hardened" means that the coating becomes insoluble or non-dispersible in the fountain solution and ink on the press and may be achieved through polymerization and/or crosslinking of the coating.

After imaging, the plate precursor is optionally heated, hereinafter also referred to as "pre-heat", to enhance or to speed-up the polymerization and/or crosslinking reaction. This pre-heat step is carried out preferably at a temperature of about 80° C. to 150° C. and preferably for a dwell time of about 5 seconds to 1 minute and preferably in a pre-heating unit. The pre-heating unit may include heating elements such as IR-lamps, UV-lamps, heated air, heated roll, etc.

Subsequently to the imaging step or the optional pre-heat step, the plate precursor is treated with water or an aqueous solution whereby at least a portion of the oxygen barrier layer is removed. This oxygen barrier layer is present on top of the image-recording layer and includes a water-soluble or water-swellable polymer. As a result, the oxygen permeablility of the coating is increased to such an extent that curing of the non-exposed areas of the coating, exposed to ambient light, is inhibited by quenching of free radicals by atmospheric oxygen. An improved stability of the non-exposed areas of the coating is obtained, i.e., undesirable curing of the non-exposed areas by ambient light is prohibited resulting in a daylight stable lithographic image.

Since the coating at the non-exposed areas is not completely removed from the support, the hydrophilic surface of the support is protected from contamination (e.g., oxidation) and damaging (e.g., scratches) by the coating remaining on the plate. As a result, an additional benefit is obtained because an additional gumming step is not required to protect the surface of the support at the non-exposed areas.

In the on-press processing step, the treated plate precursor is mounted on the plate cylinder of the printing press and the non-exposed areas of the coating are removed by rotating the plate cylinder while feeding dampening liquid and/or ink to the coating. This treatment with water or an aqueous solution has the benefit that, in the on-press processing step, the residual coating at the non-exposed areas is rapidly removed, for example, after a small number of printed sheets, a complete clean-out is obtained. The term "clean-out" means the removal of the coating in the non-exposed areas revealing the hydrophilic surface of the support. As a result, the methods of the various preferred embodiments of the present invention have the advantage that a faster start-up of the plate on the press is obtained. The term "a faster start-up" means an improved ink-acceptance of the exposed areas.

The Support

A particularly preferred lithographic support is an electrochemically grained and anodized aluminum support. Graining and anodizing of aluminum supports is well known. The acid used for graining can be e.g., nitric acid or sulfuric acid. The acid used for graining preferably includes hydrogen chloride. Also mixtures of, e.g., hydrogen chloride and acetic acid can be used. The relationship between electrochemical graining and anodizing parameters such as electrode voltage, nature, and concentration of the acid electrolyte or power consumption on the one hand and the obtained lithographic quality in terms of Ra and anodic weight (g/m$^2$ of Al$_2$O$_3$ formed on the aluminum surface) on the other hand is well known. More details about the relationship between various production parameters and Ra or anodic weight can be found in, e.g., the article "Management of Change in the Aluminium Printing Industry" by F. R. Mayers, published in the ATB Metallurgie Journal, Vol. 42 No. 1-2, (2002), page 69.

The anodized aluminum support may be subject to a so-called post-anodic treatment to improve the hydrophilic properties of its surface. For example, the aluminum support may be silicated by treating its surface with a sodium silicate solution at elevated temperature, e.g., 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer including at least 30 mol % of acrylic acid monomeric units, e.g., GLASCOL E15, a polyacrylic acid, commercially available from ALLIED COLLOIDS.

The grained and anodized aluminum support may be a sheet-like material such as a plate or it may be a cylindrical element such as a sleeve which can be slid around a print cylinder of a printing press.

The support can also be a flexible support, which may be provided with a hydrophilic layer, hereinafter called 'base layer'. The flexible support is, e.g., paper, plastic film, or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate, or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in, e.g., EP-A 1 025 992.

The Coating

The coating on the support includes at least one image-recording layer including a photocurable composition, hereinafter also referred to as "photocurable layer" or "photopolymerizable layer", and, on the photocurable layer, an oxygen-barrier layer which includes a water-soluble or water-swellable polymer, is present. The coating may further include an intermediate layer between the photocurable layer and the support.

The photocurable composition includes a compound capable of forming free radicals upon image-wise exposure, hereinafter also referred to as a "free radical initiator", optionally in the presence of a sensitizer. The photocurable composition may further include a polymerizable compound, a polymeric binder, and a compound capable of interacting with the support, hereinafter also referred to as "adhesion promoting compound". The adhesion promoting compound is preferably a compound having an ethylenically unsaturated group and may be present in the photocurable layer and/or in the intermediate layer, preferably in the intermediate layer.

The thickness of the coating preferably ranges between 0.4 and 10 g/m$^2$, more preferably between 0.5 and 5 g/m$^2$, most preferably between 0.6 and 3 g/m$^2$.

The photopolymerizable layer has a coating thickness preferably ranging between 0.4 and 5.0 g/m$^2$, more preferably between 0.5 and 3.0 g/m$^2$, most preferably between 0.6 and 2.2 g/m$^2$.

The optional intermediate layer has a coating thickness preferably ranging between 0.001 and 1.5 g/m$^2$, more preferably between 0.003 and 1.0 g/m$^2$, most preferably between 0.005 and 0.7 g/m$^2$.

The Adhesion Promoting Compound

The adhesion promoting compound is a compound capable of interacting with the support, preferably a compound having an addition-polymerizable ethylenically unsaturated bond and a functional group capable of interacting with the support, more preferably a functional group capable of interacting with a grained and anodized aluminum support. By "interacting" it is understood each type of physical and/or chemical reaction or process whereby, between the functional group and the support, a bond is formed which can be a covalent bond, an ionic bond, a complex bond, a coordinate bond, or a hydrogen-bridge bond, and which can be formed by an adsorption process, a chemical reaction, an acid-base reaction, a complex-forming reaction, or a reaction of a chelating group or a ligand. The adhesion promoting compound is present in the photopolymerizable layer and/or in an intermediate layer between the photopolymerizable layer and the support.

The adhesion promoting compound may be selected from at least one of the low molecular weight compounds or polymeric compounds as described in EP-A 851 299 from lines 22 on page 3 to line 1 on page 4, EP-A 1 500 498 from paragraph [0023] on page 7 to paragraph [0052] on page 20, EP-A 1 495 866 paragraph [0030] on page 5 to paragraph [0049] on page 11, EP-A 1 091 251 from paragraph [0014] on page 3 to paragraph [0018] on page 20, and EP-A 1 520 694 from paragraph [0023] on page 6 to paragraph [0060] on page 19. Preferred compounds are those compounds which include a phosphate or phosphonate group as the functional group capable of adsorbing on the aluminum support and which include an addition-polymerizable ethylenic double bond reactive group, especially those described in EP-A 851 299 from lines 22 on page 3 to line 1 on page 4 and EP-A 1 500 498 from paragraph [0023] on page 7 to paragraph [0052] on page 20. Also preferred are those compounds which include tri-alkyl-oxy silane groups, hereinafter also referred to as "trialkoxy silane" groups, wherein the alkyl is preferably methyl or ethyl, or wherein the trialkyloxy silane groups are at least partially hydrolyzed to silanol groups, as the functional group capable of adsorbing on the support, especially silane coupling agents having an addition-polymerizable ethylenic double bond reactive group as described in EP-A 1 557 262 paragraph [0279] on page 49 and EP-A 1 495 866 paragraph [0030] on page 5 to paragraph [0049] on page 11.

The adhesion promoting compound may be present in the photopolymerizable layer in an amount ranging between 1 and 50 wt %, preferably between 3 and 30 wt %, more preferably between 5 and 20 wt % of the non-volatile components of the composition.

The adhesion promoting compound may be present in the intermediate layer in an amount of at least 50 wt %, preferably at least 80 wt %, more preferably at least 90 wt %, most preferably 100 wt % of the non-volatile components of the composition.

The Polymerizable Compound and the Polymerization Initiator

According to one preferred embodiment of the present invention, the polymerizable monomer or oligomer is a monomer or oligomer including at least one epoxy or vinyl ether functional group and the initiator is a Bronsted acid generator capable of generating a free acid, optionally in the presence of a sensitizer, upon exposure, hereinafter the initiator also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl)adipate, difunctional bisphenol Aepichlorohydrin epoxy resin, and multifunctional epichlorohydrinitetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating a Bronsted acid, they also generate free radicals during photo or thermal decomposition.

According to a more preferred embodiment of the present invention, the polymerizable monomer or oligomer is a ethylenically unsaturated compound, having at least one terminal ethylenic group, hereinafter also referred to as a "free-radical polymerizable monomer", and the initiator is a compound, capable of generating free radicals, optionally in the presence of a sensitizer, upon exposure, hereinafter the initiator also referred to as a "free radical initiator".

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have another double bond or epoxide group, in addition to the (meth)acrylate group. The (meth)acrylate monomers may also contain an acidic (such as carboxylic acid) or basic (such as amine) functionality.

Any free radical initiator capable of generating free radicals directly or in the presence of a sensitizer upon exposure can be used as a free radical initiator. Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl)phenyliodonium hexafluoroantimonate, triarylsulfonium hexafluorophosphate, triarylsulfonium p-toluenesulfonate, (3-phenylpropan-2-onyl)triaryl phosphonium hexafluoroantimonate, and N-ethoxy(2-methyl)pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxy-ethylenoxy)-phen-1-yl]-s-triazine, and s-triazines as described in U.S. Pat. Nos. 5,955,238, 6,037,098, 6,010,824, and 5,629,354); and titanocene(bis(etha.9-2,4-cyclopentadien-1-yl)bis[2,6-difluoro-3-(1H-pyrrol-1-yl)phenyl]titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines.

Known photopolymerization initiators can be used in the composition of the preferred embodiments of the present invention. In a preferred embodiment of the present invention, the photopolymerizable composition includes a hexaaryl-bisimidazole (HABI; dimer of triaryl-imidazole) compound as a photopolymerization initiator alone or in combination with further photoinitiators.

A procedure for the preparation of hexaarylbisimidazoles is described in DE 1470 154 and their use in photopolymerizable compositions is documented in EP 24 629, EP 107 792, U.S. Pat. No. 4,410,621, EP 215 453, and DE 3 211 312. Preferred derivatives are, e.g., 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbisimidazole, 2,2'-bis(2,4-dichlorophenyl)-4,5,4',5'-tetraphenylbisimidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl)bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis(2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'-tetraphenylbisimidazole, and 2,2'-bis(2,6-difluorophenyl)-4,5,4',5'-tetraphenylbisimidazole.

The amount of the HABI photoinitiator typically ranges from 0.01 to 30% by weight, preferably from 0.5 to 20% by weight, relative to the total weight of the non volatile components of the photopolymerizable composition.

A very high sensitivity can be obtained in the context of a preferred embodiment of the present invention by the combination of an optical brightener as the sensitizer and a hexaarylbisimidazole as the photoinitiator.

Suitable classes of photoinitiators other than hexaarylbisimidazole compounds include aromatic ketones, aromatic onium salts, organic peroxides, thio compounds, ketooxime ester compounds, borate compounds, azinium compounds, metallocene compounds, active ester compounds and compounds having a carbon-halogen bond, but preferably the composition includes a non-boron including photopolymerization initiator and particularly preferred the photopolymerization initiator includes no boron compound. Many specific examples of photoinitiators suitable for preferred embodiments of the present invention can be found in EP-A 1 091 247. Other preferred initiators are trihalo methyl sulphones.

Preferably, hexaarylbisimidazole compounds and/or metallocene compounds are used alone or in combination with other suitable photoinitiators, in particular with aromatic ketones, aromatic onium salts, organic peroxides, thio compounds, ketoxime ester compounds, azinium compounds, active ester compounds, or compounds having a carbon halogen bond.

In a preferred embodiment of the present invention, the hexaarylbisimidazole compounds make more than 50 mol-%, preferably at least 80 mol-% and particularly preferred at least 90 mol-% of all the photoinitiators used in the photopolymerizable composition.

According to another preferred embodiment of the present invention, the polymerizable monomer or oligomer may be a combination of a monomer or oligomer including at least one epoxy or vinyl ether functional group and a polymerizable ethylenically unsaturated compound, having at least one terminal ethylenic group, and the initiator may be a combination of a cationic initiator and a free-radical initiator. A monomer or oligomer including at least one epoxy or vinyl ether functional group and a polymerizable ethylenically unsaturated compound, having at least one terminal ethylenic group, can be the same compound wherein the compound contains both an ethylenic group and epoxy or vinyl ether group. Examples of such compounds include epoxy functional acrylic monomers, such as glycidyl acrylate. The free radical initiator and the cationic initiator can be the same compound if the compound is capable of generating both free radicals and a free acid. Examples of such compounds include various onium salts such as diaryliodonium hexafluoroantimonate and s-triazines such as 2,4-bis(trichloromethyl)-6-[(4-ethoxyethylenoxy)-phen-1-yl]-s-triazine which are capable of generating both free radicals and a free acid in the presence of a sensitizer.

The photopolymerizable layer may also include a multifunctional monomer. This monomer contains at least two functional groups selected from an ethylenically unsaturated group and/or an epoxy or vinyl ether group. Particular multifunctional monomers for use in the photopolymer coating are disclosed in U.S. Pat. No. 6,410,205, U.S. Pat. No. 5,049, 479, EP 1079276, EP 1369232, EP 1369231 EP 1341040, U.S. 2003/0124460, EP 1241002, EP 1288720, and in the reference book including the cited references: Chemistry & Technology UV & EB Formulation for Coatings, Inks & Paints, Volume 2, Prepolymers and Reactive Diluents for UV and EB Curable Formulations by N. S. Allen, M. A. Johnson, P. K. T. Oldring, M. S. Salim, Edited by P. K. T. Oldring, 1991, ISBN 0 947798102. Particularly preferred are urethane (meth)acrylate multifunctional monomers, which can be used alone or in combination with other (meth)acrylate multifunctional monomers.

The photopolymerizable layer may also include a co-initiator. Typically, a co-initiator is used in combination with a free radical initiator and/or cationic initiator. Particular co-initiators for use in the photopolymer coating are disclosed in U.S. Pat. No. 6,410,205, U.S. Pat. No. 5,049,479, EP 1079276, 1369232, EP 1369231, EP 1341040, U.S. 2003/0124460, EP 1241002, EP 1288720, and in the reference book including the cited references: Chemistry & Technology UV & EB Formulation for Coatings, Inks & Paints, Volume 3, Photoinitiators for Free Radical and Cationic Polymerisation by K. K. Dietliker, Edited by P. K. T. Oldring, 1991, ISBN 0 947798161.

The photopolymerizable layer may also include an inhibitor. Particular inhibitors for use in the photopolymer coating are disclosed in U.S. Pat. No. 6,410,205, EP 1288720, and WO 2005/109103.

Binder of the Photocurable Layer

The photocurable layer may also include a binder. The binder can be selected from a wide series of organic polymers. Compositions of different binders can also be used. Useful binders include for example chlorinated polyalkylene (in particular chlorinated polyethylene and chlorinated polypropylene), polymethacrylic acid alkyl esters or alkenyl esters (in particular polymethyl(meth)acrylate, polyethyl(meth)acrylate, polybutyl(meth)acrylate, polyisobutyl(meth)acrylate, polyhexyl(meth)acrylate, poly(2-ethylhexyl) (meth)acrylate and polyalkyl(meth)acrylate copolymers of (meth) acrylic acid alkyl esters or alkenyl esters with other copolymerizable monomers (in particular with (met)acrylonitrile, vinyl chloride, vinylidene chloride, styrene and/or butadiene), polyvinyl chloride (PVC, vinylchloride/(meth)acrylonitrile copolymers, polyvinylidene chloride (PVDC), vinylidene chloride/(meth)acrylonitrile copolymers, polyvinyl acetate, polyvinyl alcohol, polyvinyl pyrrolidone, copolymers of vinyl pyrrolidone or alkylated vinyl pyrrolidone, polyvinyl caprolactam, copolymers of vinyl caprolactam, poly(meth)acrylonitrile, (meth)acrylonitrile/styrene copolymers, (meth)acrylamide/alkyl(meth)acrylate copolymers, (meth)acrylonitrile/butadiene/styrene (ABS) terpolymers, polystyrene, poly($\alpha$-methylstyrene), polyamides, polyurthanes, polyesters, methyl cellulose, ethylcellulose, acetyl cellulose, hydroxy-($C_1$-$C_4$-alkyl) cellulose, carboxymethyl cellulose, polyvinyl formal, and polyvinyl butyral. Particularly preferred binders are polymers having vinylcaprolactam, vinylpyrrolidone or alkylated vinylpyrrolidone as monomeric units. Alkylated vinylpyrrolidone polymers can be obtained by grafting alfa-olefines onto the vinylpyrrolidone polymer backbone. Typical examples of such products are the Agrimer AL Graft polymers commercially available from ISP. The length of the alkylation group may vary from $C_4$ to $C_{30}$. Other useful binders are binders containing carboxyl groups, in particular copolymers containing monomeric units of $\alpha,\beta$-unsaturated carboxylic acids or monomeric units of $\alpha,\beta$-unsaturated dicarboxylic acids (preferably acrylic acid, methacrylic acid, crotonic acid, vinylacetic acid, maleic acid or itaconic acid). The term "copolymers" means, in the context of the preferred embodiments of the present invention, polymers containing units of at least 2 different monomers, thus also terpolymers and higher mixed polymers. Particular examples of useful copolymers are those containing units of (meth)acrylic acid and units of alkyl(meth)acrylates, allyl(meth)acrylates and/or (meth)acrylonitrile as well as copolymers containing units of crotonic acid and units of alkyl(meth)acrylates and/or (meth) acrylonitrile and vinylacetic acid/alkyl(meth)acrylate copolymers. Also suitable are copolymers containing units of maleic anhydride or maleic acid monoalkyl esters. Among these are, for example, copolymers containing units of maleic anhydride and styrene, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. Further useful binders are polymers in which groups with acid hydrogen atoms are present, some or all of which are converted with activated isocyanates. Examples of these polymers are products obtained by conversion of hydroxyl-containing polymers with aliphatic or aromatic sulfonyl isocyanates or phosphinic acid isocyanates. Also suitable are polymers with aliphatic or aromatic hydroxyl groups, for example copolymers containing units of hydroxyalkyl (meth) acrylates, allyl alcohol, hydroxystyrene or vinyl alcohol, as well as epoxy resins, provided they carry a sufficient number of free OH groups. Particularly useful binders and particular useful reactive binders are disclosed in EP 1 369 232, EP 1 369 231, EP 1 341 040, U.S. 2003/0124460, EP 1 241 002, EP 1 288 720, U.S. Pat. No. 6,027,857, U.S. Pat. No. 6,171,735, and U.S. Pat. No. 6,420,089.

The organic polymers used as binders preferably have a typical mean molecular weight $M_w$ between 600 and 700,000, preferably between 1,000 and 350,000. Preference is further given to polymers having an acid number between 10 to 250, preferably 20 to 200, or a hydroxyl number between 50 and 750, preferably between 100 and 500. The amount of binder (s) generally ranges from 10 to 90% by weight, preferably 20 to 80% by weight, relative to the total weight of the non-volatile components of the composition.

Also, particularly suitable binders are copolymers of vinylacetate and vinylalcohol, preferably including vinylalcohol in an amount of 10 to 98 mol % vinylalcohol, more preferably between 20 and 95 mol %, most preferably 30 and 75 mol %, best results are obtained with 40 to 56 mol % vinylalcohol. The ester-value, measured by the method as defined in DIN 53 401, of the copolymers of vinylacetate and vinylalcohol ranges preferably between 25 and 700 mg KOH/g, more preferably between 50 and 500 mg KOH/g, most preferably between 100 and 300 mg KOH/g. The viscosity of the copolymers of vinylacetate and vinylalcohol are measured on a 4% by weight aqueous solution at 20° C. as defined in DIN 53 015 and the viscosity ranges preferably between 3 and 60 mPa·s, more preferably between 4 and 30 mPa·s, most preferably between 5 and 25 mPa·s. The average molecular weight $M_W$ of the copolymers of vinylacetate and vinylalcohol ranges preferably between 5,000 and 500,000 g/mol, more preferably between 10,000 and 400,000 g/mol, most preferably between 15,000 and 250,000 g/mol.

Other suitable binders are disclosed in EP 152 819 B1 on page 2 lines 50-page 4 line 20, and in paragraph [0013] on page 3 of EP 1 043 627 B1.

The polymeric binder may also include a hydrophobic backbone, and pendant groups including for example a hydrophilic poly(alkylene oxide) segment. The polymeric binder may also include pendant cyano groups attached to the hydrophobic backbone. A combination of such binders may also be employed. Generally the polymeric binder is a solid at room temperature, and is typically a non-elastomeric thermoplastic. The polymeric binder includes both hydrophilic and hydrophobic regions, which is thought to be important for enhancing differentiation of the exposed and unexposed areas by facilitating developability. Generally the polymeric binder is characterized by a number average molecular weight (Mn) in the range from about 10,000 to 250,000, more commonly in the range from about 25,000 to 200,000. The polymerizable composition may include discrete particles of the polymeric binder. Preferably, the discrete particles are particles of the polymeric binder which are suspended in the polymerizable composition. The presence of discrete particles tends to promote developability of the unexposed areas. Specific examples of the polymeric binders according to this preferred embodiment are described in U.S. Pat. No. 6,899,994, U.S. 2004/0260050, U.S. 2005/0003285, U.S. 2005/0170286, and U.S. 2005/0123853. In addition to the polymeric binder of this preferred embodiment, the imageable layer may optionally include one or more co-binders. Typical co-binders are water-soluble or water-dispersible polymers, such as, cellulose derivatives, poly vinyl alcohol, poly acrylic acid poly (meth)acrylic acid, poly vinyl pyrrolidone, polylactide, poly vinyl phosphonic acid, synthetic co-polymers, such as the co-polymer of an alkoxy polyethylene glycol (meth)acrylate. Specific examples of co-binders are described in U.S. 2004/0260050, U.S. 2005/0003285, and U.S. 2005/0123853. Printing plate precursors, the imageable layer of which includes a binder and optionally a co-binder according to this preferred embodiment are described in more detail in U.S. 2004/0260050, U.S. 2005/0003285, and U.S. 2005/0123853.

Surfactant

Various surfactants may be added into the photopolymerizable layer to allow or enhance the developability of the precursor with a gum solution. Both polymeric and small molecule surfactants can be used. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20%, and most preferably between 1 and 15%.

Sensitizer

The photocurable composition may also include a sensitizer. Highly preferred sensitizers are violet light absorbing sensitizers, having an absorption spectrum between 350 nm and 450 nm, preferably between 370 nm and 420 nm, more preferably between 390 nm and 415 nm. Particularly preferred sensitizers are disclosed in EP 1 349 006 paragraphs [0007] to [0009], WO 2005/029187, and WO 2004/047930, including the cited references in these patent applications. Other highly preferred sensitizers are infrared light absorbing dyes, having an absorption spectrum between 750 nm and 1300 nm, preferably between 780 nm and 1200 nm, more preferably between 800 nm and 1100 nm. Particularly preferred sensitizers are heptamethinecyane dyes, especially the dyes disclosed in EP 1 359 008 paragraphs [0030] to [0032]. Other preferred sensitizers are blue, green, or red light absorbing sensitizers, having an absorption spectrum between 450 nm and 750 nm. Useful sensitizers can be selected from the sensitizing dyes disclosed in U.S. Pat. No. 6,410,205, U.S. Pat. No. 5,049,479, EP 1 079 276, EP 1 369 232, EP 1 369 231, EP 1 341 040, U.S. 2003/0124460, EP 1 241 002, and EP 1 288 720.

Colorant

The photopolymerizable layer or another layer of the coating may also include a colorant. The colorant can be present in the photopolymerizable layer or in a separate layer below or above the photopolymerizable layer. After treating with water or an aqueous solution, at least a portion of the colorant remains on the hardened coating areas, and a visible image can be produced on the support by removing at least a portion of the top layer, optionally including the colorant, at the non-exposed areas.

The colorant can be a dye or a pigment. A dye or pigment can be used as the colorant when the layer, including the dye or pigment, is colored for the human eye.

The colorant can be a pigment. Various types of pigments can be used such as organic pigments, inorganic pigments, carbon black, metallic powder pigments, and fluorescent pigments. Organic pigments are preferred.

Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

Specific examples of pigments usable as the colorant are the following (herein C.I. is an abbreviation for Color Index; by a Blue colored pigment it is understood a pigment that appears blue to the human eye; the other colored pigments have to be understood in an analogous way):

Blue colored pigments which include C.I. Pigment Blue 1, C.I. Pigment Blue 2, C.I. Pigment Blue 3, C.I. Pigment Blue 15:3, C.I. Pigment Blue 15:4, C.I. Pigment Blue 15:34, C.I. Pigment Blue 16, C.I. Pigment Blue 22, C.I. Pigment Blue 60 and the like; and C.I. Vat Blue 4, C.I. Vat Blue 60 and the like;

Red colored pigments which include C.I. Pigment Red 5, C.I. Pigment Red 7, C.I. Pigment Red 12, C.I. Pigment Red 48 (Ca), C.I. Pigment Red 48 (Mn), C.I. Pigment Red 57 (Ca), C.I. Pigment Red 57:1, C.I. Pigment Red 112, C.I. Pigment Red 122, C.I. Pigment Red 123, C.I. Pigment Red 168, C.I. Pigment Red 184, C.I. Pigment Red 202, and C.I. Pigment Red 209;

Yellow colored pigments which include C.I. Pigment Yellow 1, C.I. Pigment Yellow 2, C.I. Pigment Yellow 3, C.I. Pigment Yellow 12, C.I. Pigment Yellow 13, C.I. Pigment Yellow 14C, C.I. Pigment Yellow 16, C.I. Pigment Yellow 17, C.I. Pigment Yellow 73, C.I. Pigment Yellow 74, C.I. Pigment Yellow 75, C.I. Pigment Yellow 83, C.I. Pigment Yellow 93, C.I. Pigment Yellow 95, C.I. Pigment Yellow 97, C.I. Pigment Yellow 98, C.I. Pigment Yellow 109, C.I. Pigment Yellow 110, C.I. Pigment Yellow 114, C.I. Pigment Yellow 128, C.I. Pigment Yellow 129, C.I. Pigment Yellow 138, C.I. Pigment Yellow 150, C.I. Pigment Yellow 151, C.I. Pigment Yellow 154, C.I. Pigment Yellow 155, C.I. Pigment Yellow 180, and C.I. Pigment Yellow 185;

Orange colored pigments include C.I. Pigment Orange 36, C.I. Pigment Orange 43, and a mixture of these pigments. Green colored pigments include C.I. Pigment Green 7, C.I. Pigment Green 36, and a mixture of these pigments;

Black colored pigments include: those manufactured by Mitsubishi Chemical Corporation, for example, No. 2300, No. 900, MCF 88, No. 33, No. 40, No. 45, No. 52, MA 7, MA 8, MA 100, and No. 2200 B; those manufactured by Columbian Carbon Co., Ltd., for example, Raven 5750, Raven 5250, Raven 5000, Raven 3500, Raven 1255, and Raven 700; those manufactured by Cabot Corporation, for example, Regal 400 R, Regal 330 R, Regal 660 R, Mogul L, Monarch 700, Monarch 800, Monarch 880, Monarch 900, Monarch 1000, Monarch 1100, Monarch 1300, and Monarch 1400; and those manufactured by Degussa, for example, Color Black FW 1, Color Black FW 2, Color Black FW 2 V, Color Black FW 18, Color Black FW 200, Color Black S 150, Color Black S 160, Color Black S 170, Printex 35, Printex U, Printex V, Printex 140 U, Special Black 6, Special Black 5, Special Black 4A, and Special Black 4.

Other types of pigments such as brown pigments, violet pigments, fluorescent pigments, and metallic powder pigments can also be used as the colorant. The pigments may be used alone or as a mixture of two or more pigments as the colorant.

Blue colored pigments, including cyan pigments, are preferred.

The pigments may be used with or without being subjected to a surface treatment of the pigment particles. Preferably, the pigments are subjected to a surface treatment. Methods for the surface treatment include methods of applying a surface coat of resin, methods of applying surfactant, and methods of bonding a reactive material (for example, a silane coupling agent, an epoxy compound, polyisocyanate, or the like) to the surface of the pigment. Suitable examples of pigments with a surface treatment are the modified pigments described in WO 02/04210. Specifically, the blue colored modified pigments described in WO 02/04210 are preferred as the colorant in a preferred embodiment of the present invention.

The pigments have a particle size which is preferably less than 10 μm, more preferably less than 5 μm and especially preferably less than 3 μm. The method for dispersing the pigments may be any known dispersion method which is used for the production of ink or toner or the like. Dispersing machines include an ultrasonic disperser, a sand mill, an attritor, a pearl mill, a super mill, a ball mill, an impeller, a dispenser, a KD mill, a colloid mill, a dynatron, a three-roll mill, and a press kneader. Details thereof are described in "Latest Pigment Applied Technology" (CMC Publications, published in 1986).

A dispersing agent may be omitted in the preparation of dispersions of so-called self-dispersing pigments. Specific examples of self-dispersing pigments are pigments which are subjected to a surface treatment in such a way the pigment surface is compatible with the dispersing liquid. Typical examples of self-dispersing pigments in an aqueous medium are pigments which have ionic or ionizable groups or polyethyleneoxide chains coupled to the particle-surface. Examples of ionic or ionizable groups are acid groups or salts thereof such as carboxylic acid group, sulphonic acid, phosphoric acid, or phosphonic acid and alkali metal salts of these acids. Suitable examples of self-dispersing pigments are described in WO 02/04210 and these are preferred in a preferred embodiment of the present invention. The blue colored self-dispersing pigments in WO 02/04210 are preferred.

Typically, the amount of pigment in the coating may be in the range of about 0.005 g/m$^2$ to 2 g/m$^2$, preferably about 0.007 g/m$^2$ to 0.5 g/m$^2$, more preferably about 0.01 g/m$^2$ to 0.2 g/m$^2$, most preferably about 0.01 g/m$^2$ to 0.1 g/m$^2$.

The colorant can also be a dye. Any known dyes, such as commercially available dyes or dyes described in, for example, "Dye Handbook" (edited by the Organic Synthetic Chemistry Association, published in 1970) which are colored for the human eye, can be used as the colorant in the photopolymerizable coating. Specific examples thereof include azo dyes, metal complex salt azo dyes, pyrazolone azo dyes, anthraquinone dyes, phthalacyanine dyes, carbionium dyes, quinonimine dyes, methine dyes, and the like. Phthalocyanine dyes are preferred. Suitable dyes are salt-forming organic dyes and may be selected from oil-soluble dyes and basic dyes. Specific examples thereof are (herein is CI an abbreviation for Color Index): Oil Yellow 101, Oil Yellow 103, Oil Pink 312, Oil Green BG, Oil Blue GOS, Oil Blue 603, Oil Black BY, Oil Black BS, Oil Black T-505, Victoria Pure Blue, Crystal Violet (CI42555), Methyl Violet (CI42535), Ethyl Violet, Rhodamine B (CI415170B), Malachite Green (CI42000), Methylene Blue (CI52015). Also, the dyes disclosed in GB 2 192 729 may be used as the colorant.

Typically, the amount of dye in the coating may be in the range of about 0.005 g/m$^2$ to 2 g/m$^2$, preferably about 0.007 g/m$^2$ to 0.5 g/m$^2$, more preferably about 0.01 g/m$^2$ to 0.2 g/m$^2$, most preferably about 0.01 g/m$^2$ to 0.1 g/m$^2$.

Printing-Out Agent

The photopolymerizable layer or another layer of the coating may also include a printing-out agent, i.e., a compound which is capable of changing the color of the coating upon exposure. After image-wise exposure of the precursor, a visible image can be produced, hereinafter also referred to as "print-out image". The printing-out agent may be a compound as described in EP-A-1 491 356 paragraphs [0116] to [0119] on page 19 and 20, and in U.S. 2005/0008971 paragraphs [0168] to [0172] on page 17. Preferred printing-out agents are the compounds described in WO 2006/005688, from line 1 page 9 to line 27 page 20. More preferred are the IR-dyes as described in EP 1736312, from line 32 page 5 to line 9 page 32.

The Contrast

The contrast of the image formed after image-wise exposure and treating with water or an aqueous solution is defined as the difference between the optical density at the exposed area to the optical density at the non-exposed area, and this contrast is preferably as high as possible. This enables the end-user to determine immediately whether or not the precursor has already been exposed and processed with a gum solution, to distinguish the different color selections, and to inspect the quality of the image on the treated plate precursor.

The contrast increases with increasing optical density in the exposed area and/or decreasing optical density in the non-exposed areas. The optical density in the exposed area may increase with the amount and extinction coefficient of the colorant remaining in the exposed areas and the intensity of color formed by the printing-out agent. In the non-exposed areas, it is preferred that the amount of the colorant is as low as possible and that the intensity of the color print-out agent is as low as possible. The optical density can be measured in reflectance by an optical densitometer, equipped with several filters (e.g., cyan, magenta, yellow). The difference in optical density at the exposed area and the non-exposed area preferably has a value of at least 0.3, more preferably at least 0.4, most preferably at least 0.5. There is no specific upper limit for the contrast value, but typically the contrast is not higher than 3.0 or even not higher than 2.0. In order to obtain a good visual contrast for a human observer the type of color of the colorant may also be important. Preferred colors for the colorant are cyan or blue colors, i.e., by blue color it is understood a color that appears blue to the human eye.

The Top Layer

According to a preferred embodiment of the present invention, the coating includes a top layer which acts as an oxygen barrier layer, hereinafter also referred to as "overcoat layer" or "overcoat". Preferred binders which can be used in the top layer are polyvinyl alcohol and the polymers disclosed in WO 2005/029190, U.S. Pat. No. 6,410,205, and EP 1 288 720, including the cited references in these patents and patent applications. The most preferred binder for the top layer is polyvinylalcohol. The polyvinylalcohol preferably has a hydrolysis degree ranging between 74 mol % and 99 mol %. The weight average molecular weight of the polyvinylalcohol can be measured by the viscosity of an aqueous solution, 4% by weight, at 20° C. as defined in DIN 53 015, and this viscosity number ranges preferably between 3 and 26, more preferably between 3 and 15, most preferably between 3 and 10.

The coating thickness of the top layer is preferably between 0.25 and 1.75 $g/m^2$, more preferably between 0.25 and 1.3 $g/m^2$, most preferably between 0.25 and 1.0 $g/m^2$. In a more preferred embodiment of the present invention, the top layer has a coating thickness between 0.25 and 1.75 $g/m^2$ and includes a polyvinylalcohol having a hydrolysis degree ranging between 74 mol % and 99 mol % and a viscosity number as defined above ranging between 3 and 26.

The top layer may also include a component selected from the compounds of the gum solution as described above.

Exposure

The image-wise exposing step is carried out off-press in a plate setter, i.e., an exposure apparatus suitable for image-wise exposing the precursor by a laser such as a laser diode emitting around 830 nm, a NdYAG laser emitting around 1060 nm, a violet laser emitting around 400 nm, or a gas laser such as Ar laser, or by a digital modulated UV-exposure, e.g., by digital mirror devices, or by a conventional exposure in contact with a mask. In a preferred embodiment of the present invention, the precursor is image-wise exposed by a laser emitting IR-light or violet light.

Pre-Heating

After this image-wise exposing step, the precursor may be heated in a pre-heating unit to enhance or to speed-up the polymerization and/or crosslinking reaction. In a preferred embodiment, this pre-heat step may be carried out within a time period of less than 10 minutes, preferably less than 5 minutes, more preferably less than 1 minute, most preferably the pre-heat is carried out immediately after the image-wise exposing, i.e., within less than 30 seconds. There is no time limit before the heating step may start, but the precursor is heated as soon as possible after exposing, usually after a few seconds to transport the plate to the pre-heating unit and start the heating process. In this pre-heating step, the precursor is heated at a temperature of preferably 80° C. to 150° C. and for a dwell time of preferably 5 seconds to 1 minute. The pre-heating unit is preferably provided with heating elements such as IR-lamps, UV-lamps, heated air, a heated metal roll, etc.

Treatment with Water or an Aqueous Solution

After image-wise exposing or the optional pre-heating step, the precursor is subsequently treated with water or an aqueous solution whereby at least a portion of the oxygen barrier layer is removed and whereby the oxygen permeability of the coating is increased to such an extent that curing of the non-exposed areas of the coating, exposed to ambient light, is inhibited by quenching of free radicals by atmospheric oxygen. In this treatment, the coating is not completely removed from the support at the non-exposed areas so that the hydrophilic surface of the support is protected by the coating remaining on the plate. In a preferred embodiment of the present invention, the coating remaining on the plate after this treatment is substantially the photocurable layer or a portion of the photocurable layer.

In this treatment, at least a portion of the oxygen barrier layer is removed by supplying water or an aqueous solution, preferably water, to the coating of the precursor. The temperature of the water or aqueous solution used in this treatment preferably ranges between 10° C. and 85° C., more preferably between 15° C. and 65° C., most preferably between 18° C. and 55° C. Several methods can be used such as the method used in traditional developing machines, wherein the water or aqueous solution is applied to the plate by rubbing in with an impregnated pad, by dipping, by spraying, by jetting, by every coating technique such as spin coating, roll coating, slot coating or gravure coating, by pouring-in, either by hand or in an automatic processing apparatus, optionally combined with mechanical rubbing such as a rotating brush. Essential in this technique is that at least a portion of the coating remains on the plate to protect the hydrophilic surface in the non-exposed areas. In a preferred embodiment of the present invention, at least 3% by weight of the coating remains on the plate, more preferably at least 5% by weight, most preferably at least 6% by weight. In another preferred embodiment of the present invention, at least 70% by weight of the oxygen barrier layer is removed, more preferably at least 85% by weight, most preferably the oxygen barrier layer is substantially completely removed. In another preferred embodiment of the present invention, the coating remaining on the plate is at least 0.1 $g/m^2$, more preferably at least 0.13 $g/m^2$, most preferably at least 0.15 $g/m^2$.

In this treatment, water or an aqueous solution is used, preferably water is used. The term aqueous includes water or mixtures of water with water-miscible organic solvents such as alcohols, e.g., methanol, ethanol, 2-propanol, butanol, iso-amyl alcohol, octanol, cetyl alcohol, etc.; glycols, e.g., ethylene glycol; glycerine; N-methylpyrrolidone; methoxypropanol; and ketones, e.g., 2-propanone and 2-butanone; etc. The water-miscible organic solvent may be present in these mixtures of at most 50% by weight, preferably less than 20% by weight, more preferably less than 10% by weight, most preferably no organic solvent is present in the aqueous solution.

The aqueous solution may further include a compound solubilized or dispersed in water or a mixture of water and a water-miscible solvent. Such compounds may be selected from the compounds used in a gumming solution as described in WO 2005/111727 from line 1 on page 6 to line 35 on page 11.

On-Press Processing

The exposed, optionally exposed and pre-heated, precursor is processed on-press, i.e., while the precursor is mounted on the plate cylinder of a lithographic printing press, by rotating the plate cylinder while feeding dampening liquid and/or ink to the coating of the precursor. In a preferred embodiment, only dampening liquid is supplied to the plate during start-up of the press. After a number of revolutions of the plate cylinder, preferably less than 50 and most preferably less than 5 revolutions, also the ink supply is switched on. In an alternative preferred embodiment, supply of dampening liquid and ink can be started simultaneously or only ink can be supplied during a number of revolutions before switching on the supply of dampening liquid.

EXAMPLES

Preparation of Aluminum Support S-1

A 0.3 mm thick aluminum foil was degreased by spraying with an aqueous solution containing 34 g/l of NaOH at 70° C. for 6 seconds and rinsed with demineralized water for 3.6 seconds. The foil was then electrochemically grained for 8 seconds using an alternating current in an aqueous solution containing 15 g/l of HCl, 15 g/l of $SO_4$ ions and 5 g/l of $Al^{3+}$ ions at a temperature of 37° C. and a current density of about 100 A/$dm^2$. Afterwards, the aluminum foil was desmutted by etching with an aqueous solution containing 145 g/l of sulfuric acid at 80° C. for 5 seconds and rinsed with demineralized water for 4 seconds. The foil was subsequently subjected to anodic oxidation for 10 seconds in an aqueous solution containing 145 g/l of sulfuric acid at a temperature of 57° C. and a current density of 33 A/$dm^2$, then washed with demineralized water for 7 seconds and post-treated for 4 seconds by spraying a solution containing 2.2 g/l of polyvinylphosphonic acid at 70° C., rinsed with demineralized water for 3.5 seconds and dried at 120° C. for 7 seconds.

The support thus obtained was characterized by a surface roughness Ra of 0.35-0.4 μm, measured with interferometer NT1100, and had an anodic weight of 4.0 g/$m^2$.

Preparation of Aluminum Support S-2

The preparation of this support is carried out in the same way as described for support S-1 with the exception that the polyvinyl phosphonic acid layer is partially removed by treatment with PD91, a water-based alkaline developer solution, commercially available from Agfa Graphics, followed by washing with water.

Preparation of Intermediate Layer I-1

The coating composition for the intermediate layer I-1 was prepared by mixing the ingredients as specified in Table 1. The resulting solution was coated with a bar-coater on a support. After coating, the plate was dried for 1 minute at 120° C. in a circulation oven.

TABLE 1

Compositions of the Intermediate Layer Solutions and Thickness of Dried Layer

| COMPOSITION/ INGREDIENTS | I-1 |
|---|---|
| Sipomer PAM 100 (1) (g) | 1.0 |
| Dowanol PM (2) (g) | 125 |
| Dry thickness (g/$m^2$) | 0.08 |

(1) Sipomer PAM 100 is a phosphate functional specialty methacrylate monomer, obtained from RHODIA. This compound was treated by extraction with methyl-tert-butylether, collection of the lower phase, and subsequent addition of 250 ppm (parts per million) of para-methoxyphenol.

(2) Dowanol PM is propylene glycol monomethylether, trade mark of Dow Chemical Company.

Preparation of Photocurable Layer P-1

The coating composition for the photocurable layer P-1 was prepared by mixing the ingredients as specified in Table 2. The resulting solution was coated with a bar-coater on an intermediate layer I-1 (precursor Type 1) and on a support without the intermediate layer I-1 (precursor Type 2). After coating, the two types of plate precursors were dried for 1 minute at 120° C. in a circulation oven. The resulting applied amount is 0.75 g/$m^2$.

TABLE 2

Compositions of the Photocurable Layer Solutions

| COMPOSITION/ INGREDIENTS | P-1 |
|---|---|
| Alcotex 552P (1) (g) | 3.75 |
| IR-dye-01 (2) (g) | 0.1775 |
| TBMPS (3) (g) | 0.2219 |
| FST 426R (4) (g) | 2.0375 |
| Edaplan LA411 (5) (g) | 0.3750 |
| Dowanol PM (g) | 39.63 |

(1) Alcotex 552P is a 40% by weight solution in water of polyvinylalcohol having a hydrolysis degree of 55 mol %, commercially available from Synthomer.

(2) IR-dye-01 has the following structure

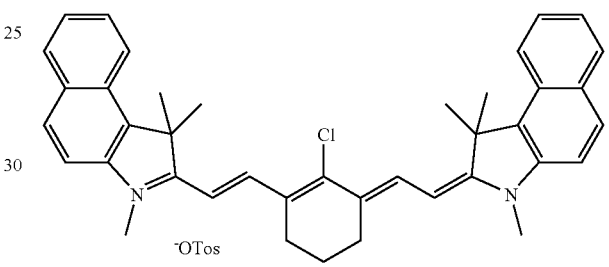

wherein $^-$OTos represents a tosylate anion.

(3) TBMPS is tri-bromo-methylphenyl-sulphone.

(4) FST 426R is a solution in 2-butanone containing 88.2 wt. % of a reaction product from 1 mole of 2,2,4-trimethyl-hexamethylenediisocyanate and 2 moles of hydroxy-ethylmethacrylate (viscosity 3.30 $mm^2$/s at 25° C.).

(5) Edaplan LA411 is a surfactant (1% solution in Dowanol PM® trade mark of Dow Chemical Company) obtained from Munzing Chemie.

Preparation of Overcoat Layer OC-1

On top of the photocurable layer a solution in water with the composition as defined in Table 3 was coated and was dried at 110° C. for 2 minutes. The so-formed protective overcoat had a dry thickness of 2.0 g/$m^2$.

TABLE 3

Composition of Overcoat Solution

| COMPONENT | OC-1 |
|---|---|
| partially hydrolyzed polyvinylalcohol (degree of hydrolysis 88%, viscosity 4 mPa · s in a solution of 4 wt. % at 20° C.) (g) | 17.03 |
| partially hydrolyzed polyvinylalcohol (degree of hydrolysis 88%, viscosity 8 mPa · s in a solution of 4 wt. % at 20° C.) (g) | 7.43 |
| fully hydrolyzed polyvinylalcohol (degree of hydrolysis 98%, viscosity 6 mPa·s in a solution of 4 wt. % at 20° C.) (g) | 14.87 |
| Acticide LA1206 (1) (g) | 0.26 |

TABLE 3-continued

| Composition of Overcoat Solution | |
|---|---|
| COMPONENT | OC-1 |
| Metolat FC 355 (2) (g) | 0.38 |
| Lutensol A8 (90%) (3) (g) | 0.032 |
| Water (g) | 960 |

(1) Acticide LA1206 is a biocide, commercially available from Thor.
(2) Metolat FC 355 is an ethoxylated ethylenediamine, commercially available from Munzing Chemie.
(3) Lutensol A8 (90%) is a surface active agent, commercially available from BASF.

Cutting of Strips

During coating and drying of all the different layers, the plates were protected from ambient light. Each type of precursor was cut into several strips and these strips were stored protected from ambient light.

Exposure

Two strips of each type precursor were imaged with a Creo Trendsetter IR laser (830 nm) at different energies varying between 100 mJ/cm$^2$ and 300 mJ/cm$^2$.

Treatment with Water and Daylight Stability Test

Subsequently to the image-wise exposing step, one strip of each precursor type was passed through the water-wash and drying section of a VSP-processor, commercially available from Agfa Graphics, to remove the overcoat and a portion of the photocurable layer. Another strip of each precursor type was not treated with water.

The water treated strip and an untreated strip of each precursor type were exposed to daylight for 30 minutes.

Table 4 summarizes the compositions of the printing plate precursors and the treatment with water.

TABLE 4

| | Precursor Composition | | | | |
|---|---|---|---|---|---|
| Precursor type | Al support | Intermediate layer | Photocurable layer | Overcoat layer | Treatment with water |
| Type 1-treated | S-2 | I-1 | P-1 | OC-1 | yes |
| Type 1-untreated | S-2 | I-1 | P-1 | OC-1 | no |
| Type 2-treated | S-2 | | P-1 | OC-1 | yes |
| Type 2-untreated | S-2 | | P-1 | OC-1 | no |

On-Press Processing

These two strips of each precursor type were subsequently mounted on a GTO46 printing press (available from Heidelberger Druckmaschinen AG), and a print job was started using K+E Novavit 800 Skinnex ink (trademark of BASF Drucksysteme GmbH) and 3% FS101 (trademark of AGFA) in 10% isopropanol as fountain liquid, a compressible blanket, and offset paper.

The clean-out is the removal of the coating in the non-exposed areas, revealing the hydrophilic surface of the support, and is defined by the number of sheets needed to obtain on the non-exposed areas an optical density of 0.0 while on the full exposed areas (or the 100% dot areas of a screen) the optical density (measured on the printed sheet) is at least 1.5, indicating an excellent ink-acceptance. The indication <5 means that a full clean-out is obtained after printing 2, 3, or 4 sheets; >250 means an insufficient clean-out even after printing 250 sheets. An insufficient clean-out means that a portion of the coating remains on the plate at the non-exposed areas and may result in toning on the press, i.e., an undesirable tendency of ink-acceptance at the non-exposed areas on the printed sheets. Depending on the amount of ink accepted on the non-image areas on the printed sheets, toning may observed at different levels corresponding with the grey-density value at the non-image areas. "Toning" means that an increase in optical density in the non-image areas can be observed by visual inspection of the printed sheets; "No Toning" means that the non-image areas are free of ink by visual inspection of the printed sheets.

Table 5 summarizes the obtained results for the treated and untreated precursors.

TABLE 5

| | Results | | |
|---|---|---|---|
| EXAMPLE number | Precursor type | Clean-out (number sheets) | Toning |
| Inventive Example 1 | Type 1-treated | <5 | No toning |
| Comparative Example 1 | Type 1-untreated | >250 | Toning |
| Inventive Example 2 | Type 2-treated | <5 | No toning |
| Comparative Example 2 | Type 2-untreated | >250 | Toning |

Coating Thickness Remaining After the Water Treatment

A non-exposed strip of precursor Type 1 and of precursor Type 2 were weighed before and after passing through the water-treatment and drying section of a VSP-processor, commercially available from Agfa Graphics, and the amount of coating removed in this water-treatment was calculated for these two precursor types.

After this water-treatment, the strips were passed through a gumming processor using the gum solution Gum-1 to remove the remainder of the coating. The strips were thoroughly washed with water to remove the adsorbed gum from the plates, dried and weighed again to calculate the remainder of the coating after the water-treatment.

Gum-1 is a solution prepared as follows:

To 750 g demineralized water 100 ml of Dowfax 3B2 (commercially available from Dow Chemical)

31.25 g 1,3-benzene disulphonic acid disodium salt (available from Riedel de Haan)

31.25 ml Versa TL77 (a polystyrene sulphonic acid available from Alco Chemical)

10.4 g trisodium citrate dihydrate, 2 ml of Acticide LA1206 (a biocide from Thor), 2.08 g of Polyox WSRN-750 (available from Union Carbide) were added under stirring and demineralized water was further added to 1000 g.

pH is between 7.2 and 7.8.

At each stage of these treatments, the optical density (hereinafter also referred to as "OD") was measured on the plate with a Gretag Macbeth D19C densitometer, commercially available from GRETAG-MACBETH AG, using cyan setting and an uncoated aluminum plate as reference.

The results are summarized in Table 6.

TABLE 6

Coating Thickness and Optical Density at Each Stage of the Treatments

| Precursor type | Treatment | Coating thickness (g/m²) experim. (theoretical) | Weight loss (%) | OD |
|---|---|---|---|---|
| Type 1 | Step 1: before water-treatment | 2.528 (2.83) | | 0.29 |
| | Step 2: after water-treatment | 0.193 | 92.4 | 0.07 |
| | Step 3: after processing | 0.00 | 100 | 0.00 |
| Type 2 | Step 1: before water-treatment | 2.282 (2.75) | | |
| | Step 2: after water-treatment | 0.165 | 92.8 | |
| | Step 3: after processing | 0.00 | 100 | |

The inventive examples in Table 5 demonstrate that the image-wise exposed precursors of Type 1 (precursor includes an adhesion promoting compound in the intermediate layer) and of Type 2 (precursor without an adhesion promoting compound) exhibit an improved daylight stability when the image-wise exposed precursor is treated with water. In Table 6 is demonstrated that after this treatment with water about 7 to 8% by weight of the coating remains on the support at the non-exposed areas. In the on-press processing, the printing plates of the inventive examples exhibit a fast and complete clean-out after printing 2, 3, or 4 sheets (less than 5 sheets) and no toning is observed on the press. In the comparative examples of Table 5, the precursors were not being treated with water after image-wise exposing and are not stable in daylight. No clean-out is obtained even after printing 250 sheets and toning appears on the press.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method of making a lithographic printing plate comprising the steps of:
   (a) providing a lithographic printing plate precursor including a support having a hydrophilic surface or which is provided with a hydrophilic layer, and a coating on the support, the coating comprising (i) at least one image-recording layer which includes a photocurable composition, the composition including a compound which is capable of forming free radicals upon image-wise exposure, and (ii) on top thereof, an oxygen-barrier layer including a water-soluble or water-swellable polymer;
   (b) image-wise exposing the coating by a laser in a plate setter;
   (c) optionally, heating the precursor in a pre-heating unit;
   (d) treating the image-wise exposed precursor in a developing unit wherein water or an aqueous solution is supplied to the coating of the precursor, wherein the oxygen-barrier layer and a portion of the image-recording layer are removed from the support at the non-exposed areas, thereby increasing the oxygen permeability of the remaining portion of the image-recording layer to such an extent that curing of the non-exposed areas of the coating by ambient light is inhibited by quenching of free radicals with oxygen, and the remaining portion of the image-recording layer protects the hydrophilic surface;
   (e) mounting the treated precursor on a plate cylinder of a lithographic printing press; and
   (f) developing the precursor by rotating the plate cylinder while feeding dampening liquid and/or ink to the coating, thereby removing the remaining portion of the image-recording layer at the non-exposed areas; wherein
   the plate setter is mechanically coupled to the developing unit of step (d) by a conveying device such that the precursor is shielded from ambient light.

2. A method according to claim 1, wherein the remaining portion of the image-recording layer is at least 3% by weight of the coating.

3. A method according to claim 1, wherein the remaining portion of the image-recording layer is at least 0.1 g/m².

4. A method according to claim 1, wherein the developing unit in step (d) is provided with at least one roller for rubbing and/or brushing the coating during the treatment.

5. A method according to claim 1, wherein the water or the aqueous solution is supplied to the coating in step (d) by jetting or spraying the water or the aqueous solution on the coating.

6. A method according to claim 1, wherein after step (b) and before step (d) the precursor is heated at a temperature between 80° C. and 150° C. for a dwell time of 5 seconds to 1 minute in a pre-heating unit, the pre-heating unit being coupled to the plate setter and to the developing unit by a mechanical plate conveying device wherein the precursor is shielded from ambient light.

7. A method according to claim 1, wherein the photocurable composition further includes an IR-absorbing compound and wherein, in step (b), the coating is image-wise exposed to IR-radiation.

8. A method according to claim 1, wherein the photocurable composition further includes a violet absorbing compound and wherein, in step (b), the coating is image-wise exposed to violet light.

9. A method according to claim 1, wherein in step (d) water is used in the treatment.

* * * * *